(12) United States Patent
Jones et al.

(10) Patent No.: US 9,236,363 B2
(45) Date of Patent: Jan. 12, 2016

(54) WEDGE BOND FOOT JUMPER CONNECTIONS

(71) Applicants: Jeffrey K. Jones, Chandler, AZ (US); Basim H. Noori, Gilbert, AZ (US); Mohd Salimin Sahludin, Sungai Gadut (MY); Fernando A. Santos, Chandler, AZ (US)

(72) Inventors: Jeffrey K. Jones, Chandler, AZ (US); Basim H. Noori, Gilbert, AZ (US); Mohd Salimin Sahludin, Sungai Gadut (MY); Fernando A. Santos, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 14/204,340

(22) Filed: Mar. 11, 2014

(65) Prior Publication Data
US 2015/0262961 A1    Sep. 17, 2015

(51) Int. Cl.
| | |
|---|---|
| *H01L 23/48* | (2006.01) |
| *H01L 23/00* | (2006.01) |
| *H01L 27/06* | (2006.01) |
| *H01L 27/07* | (2006.01) |
| *H01L 21/822* | (2006.01) |
| *H01L 23/64* | (2006.01) |
| *H01L 49/02* | (2006.01) |

(52) U.S. Cl.
CPC .............. *H01L 24/48* (2013.01); *H01L 21/822* (2013.01); *H01L 23/642* (2013.01); *H01L 23/647* (2013.01); *H01L 24/43* (2013.01); *H01L 27/0676* (2013.01); *H01L 27/0794* (2013.01); *H01L 28/20* (2013.01); *H01L 2224/438* (2013.01); *H01L 2224/45015* (2013.01); *H01L 2224/45124* (2013.01); *H01L 2224/45144* (2013.01); *H01L 2224/45147* (2013.01); *H01L 2224/4801* (2013.01); *H01L 2224/48011* (2013.01); *H01L 2224/4813* (2013.01); *H01L 2224/4847* (2013.01); *H01L 2924/1203* (2013.01); *H01L 2924/1205* (2013.01); *H01L 2924/1207* (2013.01); *H01L 2924/20658* (2013.01); *H01L 2924/30107* (2013.01)

(58) Field of Classification Search
CPC ........ H01L 24/43; H01L 24/48; H01L 29/861
USPC .......................................... 257/784
See application file for complete search history.

(56) References Cited

U.S. PATENT DOCUMENTS

| | | | |
|---|---|---|---|
| 6,194,774 B1 * | 2/2001 | Cheon ............................ | 257/531 |
| 6,348,400 B1 * | 2/2002 | Schoenfeld .................... | 438/617 |
| 6,991,970 B2 | 1/2006 | Fogal et al. | |
| 2008/0230928 A1 * | 9/2008 | Otremba ........... | H01L 23/49582 257/784 |
| 2010/0253435 A1 * | 10/2010 | Ichitsubo et al. ............. | 330/295 |

* cited by examiner

*Primary Examiner* — Long K Tran
(74) *Attorney, Agent, or Firm* — Lempia Summerfield Katz LLC (57) ABSTRACT

A semiconductor device includes a substrate, first and second bond pad structures supported by the substrate and spaced from one another by a gap, and a wire bond foot jumper extending across the gap and bonded to the first and second bond pad structures.

17 Claims, 5 Drawing Sheets

WEDGE BOND FOOT JUMPER CONNECTIONS

FIELD OF INVENTION

The present embodiments relate to semiconductor devices and, more specifically, jumper connections in semiconductor devices.

BACKGROUND

Wire bonding is an assembly procedure for semiconductor devices in which wires are attached between, for example, a semiconductor die and packaging leads. In wire bonding, bond wires are attached to bond pads located along the periphery of the semiconductor die. Each wire, or wire bond, establishes an electrical connection between a respective bond pad on the semiconductor die and a respective finger or pin of a package lead. The procedure for each bond wire begins with bonding the wire to the bond pad. The bond wire is then extended to position the other end of the bond wire at the lead finger. Once in position, the bond wire is then bonded to the lead finger. The bond wire is then severed, and the process is repeated for the next wire bond connection.

Ball bonding is one type of wire bonding technique for establishing the connections between the wires and the bond pads and the package leads. Ball bonding involves the application of heat to form the weld or connection. In thermocompression bonding, bonding wire is fed out of a capillary device. A spark or other heat source melts the end of the wire into a ball, which is positioned over the bond pad. The capillary device pushes the molten ball downward onto the bond pad. A bond is formed as a result of the heat and the compression. Once the bond is formed, more wire is fed out of the capillary device to extend the wire to the lead finger. A molten ball may again be formed and pressed against the lead finger to bond the wire thereto. Another spark or heat source severs the wire and forms the ball for the next bond.

Thermo-sonic bonding is another ball bonding technique in which ultrasonic energy is also used to form the ball and establish the bond. The ultrasonic energy is provided by the capillary device through the bond wire.

Ultrasonic, or wedge, bonding is yet another wire bonding technique. Pressure and ultrasonic forces are applied to the wire to form bonds with the bond pad and the package lead. The wire is then severed through clamping and movement of the bonding machine. Wedge-like bonds known as stitch bonds are also formed at intermediate locations at the die or package in some thermo-compression ball bonding procedures in preparation for forming the next ball.

Wire bonding has been used to form jumper connections. The bond wire extends between two points on the semiconductor device to establish an electrical connection. However, such bond wire jumpers may consume excessive space on the semiconductor die. Space for two bond pads as well as at least the minimum distance involved to allow a wire bonder to create the wire jumper. The bond wire jumper may also present excessive inductance, which may limit device performance.

BRIEF DESCRIPTION OF THE DRAWINGS

The components and the figures are not necessarily to scale, emphasis instead being placed upon illustrating the principles of the invention. Moreover, in the figures, like reference numerals designate corresponding parts throughout the different views.

DETAILED DESCRIPTION OF THE PRESENTLY PREFERRED EMBODIMENTS

Semiconductor devices and electronic apparatus having wire or wedge bond foot jumper connections between bond pad structures are described, along with methods of fabricating such devices and apparatus. A jumper connection is established between a number of bond pad structures supported by a substrate. The wedge bond foot extends across and connects the bond pad structures, which may be configured as a split bond pad. The wedge bond foot jumper may be used to connect a primary circuit with an optional or otherwise auxiliary circuit or circuit element. The connection may be established during or near device assembly. The circuits may be accessed separately via respective bond pad structures before the connection is established. The wedge bond foot jumpers of the disclosed embodiments may thus support design-for-test procedures.

The bond pad structures may be spaced from one another by a minimal distance. The bond wire is cut at (e.g., near) the wedge bond foot once the bond pad structures are connected by the wedge bond foot. With only the wedge bond foot spanning the minimally spaced bond pad structures, the wedge bond foot jumper may thus provide a low (e.g., near zero) inductance connection. For example, connections with inductance levels of about 5 pH may be achieved, which may reduce inductance by a factor of about 150 relative to typical wire bond connections.

By providing a near zero inductance connection, the wedge bond foot jumpers of the disclosed embodiments may address several challenges presented by selective or optional circuit connections in discrete or IC contexts. In addition, the disclosed embodiments may be useful in applications in which a full wire bond jumper is unsatisfactory. Bond wire jumpers may create excessive inductance (e.g., about 0.7 nH). The inductance may be problematic in many circuits, such as integrated circuits (ICs) or partially integrated circuits. For example, in radio frequency (RF) cellular bands (0.7-3 GHz), an inductance of about 0.7 nH may lead to significant detuning.

Optional connections may be useful in RF contexts in which frequency selective behavior is involved. For instance, if a low level of capacitance is connected to an RF circuit for matching impedance at high frequency, a higher level of capacitance may not be connected without option mask layers being processed, or without a jumper between two bond pads, one of which connects to the original low capacitance circuit, and the other of which connects to the additional capacitance to be connected. The inductance presented by a wire bond jumper may be problematic in such RF contexts.

Wire bond jumpers may also be problematic due to the area consumed by the wire bond. The minimum space to connect a full wire bond jumper involves two bond pads as well as the space consumed by the minimum length of wire involved in forming a repeatable wire bond. Efforts to decrease inductance through multiple parallel wires come at the expense of additional IC area. Providing or selecting circuit options through wire bonds may thus be problematic for area reasons as well.

In contrast, the wedge bond foot jumper connections of the disclosed embodiments may be provided without a large area penalty. Each bond pad structure may correspond with a half or other portion of a bond pad. Thus, in some embodiments, the wedge bond foot jumper connection may be provided in roughly the same area typically taken up by a single bond pad. Even if space is available for full wire bond jumper connections, the wire bond introduces significant inductance avoided by the disclosed embodiments.

The bond foot jumpers of the disclosed embodiments may present an optional connection that provides flexibility in manufacturing. For example, the bond foot jumpers may be useful in design-for-test probing. In some cases, design-for-test probing may otherwise not be realizable if a significantly large capacitance is connected to transistor terminals (e.g., for matching). By enabling such testing, the disclosed embodiments may thus be useful in improving yield prior to assembly. The disclosed embodiments may thus also provide low inductance connections of a matching, load, or other circuit following such probing or other testing.

The bond foot jumpers may be useful in a wide variety of applications and contexts. Some of the applications may include a circuit configurable via the wedge bond foot jumper. The circuit may be disposed in one operational configuration with the wedge bond foot jumper in place, and in another operational configuration without the bond foot jumper in place. The wedge bond foot jumper may be useful in connection with selectively providing an optional feature or component.

Some applications may involve an electrical connection with, and/or configuration of, a passive component, while others involve an active component. In some passive component examples, the bond foot jumper connection may be useful in RF circuits to provide tunable or otherwise configurable circuits or components for impedance matching or other selectivity. For example, the disclosed embodiments may allow tuning to support several bands of operation and/or to compensate for process variation. In another example, impedance matching may be provided by a configurable capacitor having one or more capacitive elements that may be connected via bond foot jumper connections. Such matching may be useful in connection with the optimization of frequency response characteristics in high power RF semiconductor products.

The bond foot jumpers are not limited to connections that add a component or circuit element. The bond foot jumpers may be used to establish a connection that effectively removes a component or circuit. For instance, other examples of configurable circuits may involve arrangements in which the bond foot jumper establishes a bypass path across a circuit element, such as a resistor, diode, or other active or passive circuit element. In some cases, the bypassed circuit element is or includes a buried circuit element. The configurability of the electronic apparatus may provide flexibility that reduces design cycle time and/or allows re-use of existing components.

An ultrasonic wire bonder may be used to form the bond foot jumper connection. The disclosed fabrication methods are not limited to a particular type of ultrasonic or other wedge bonder. Wedge bonders developed or available in the future may be used.

The disclosed embodiments are not limited to applications in which a circuit is configured via the bond foot jumper. For example, bond foot jumpers may be used to establish electrical connections after an electronic apparatus is probed or otherwise tested. The circuits coupled to one or both of the bond pad structures may be probed or otherwise accessed for testing. One or both of the circuits may thus be tested before being loaded by the other circuit via the connection.

The disclosed embodiments are not limited to use with cylindrical wires or other shapes or cross-sections. For example, the disclosed embodiments may be used in connection with the strap-shaped wires used in ribbon bonding. The terms "wire" and "wire bonding" are used herein in a broad sense to include various types of wires, including, for instance, cylindrical and ribbon wires. Various cross-sectional shapes may be used.

Although described below in connection with specific circuit examples, the disclosed embodiments may be used in connection with a wide variety of circuits and applications. The nature of the electronic apparatus and/or semiconductor devices may vary considerably.

Figure 1:
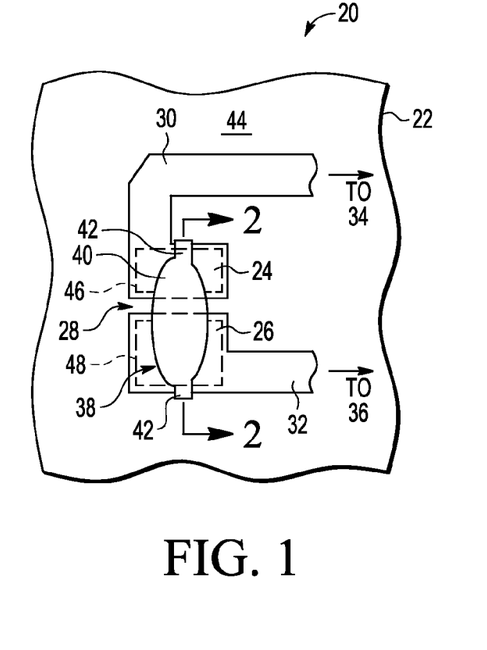
FIG. 1 is a schematic, plan view of an exemplary semiconductor device having an electrical connection established with a wire bond foot jumper in accordance with one embodiment.

FIG. 1 depicts a portion of an electronic apparatus 20 in accordance with one embodiment. The electronic apparatus 20 may be or include a semiconductor device or die. The electronic apparatus 20 includes a substrate 22, which may be or include a semiconductor substrate, such as a silicon substrate. The composition and other characteristics of the substrate 22 may vary. For example, the substrate 22 may be a composite substrate, such as a semiconductor-on-insulator (SOI) substrate. Compound semiconductor substrates may also be used.

The electronic apparatus 20 includes bond pad structures 24, 26 (or die pad structures) supported by the substrate 22 and spaced from one another by a gap 28. In this embodiment, the bond pad structures 24, 26 are disposed at ends of respective conductive lines or interconnects 30, 32. The line 30 electrically connects the bond pad structure 24 to a circuit 34 formed in and/or on the substrate 22. The line 32 electrically connects the bond pad structure 26 to a circuit 36 formed in and/or on the substrate 22. The bond pad structures 24, 26 and the lines 30, 32 may be considered components of the circuits 34, 36, respectively. The size, positioning, shape, and other characteristics of the bond pad structures 24, 26 and the lines 30, 32 may vary from the example shown. For example, the lines 30, 32 may be disposed in different metal layers. The electronic apparatus 20 may include one or more vias to electrically connect the lines 30, 32 with the bond pad structures 24, 26, respectively.

The circuit 34 may be configured as a primary circuit. The circuit 36 may be configured as an auxiliary or secondary circuit used to tune or otherwise configure the primary circuit 34 via the connection established by the jumper 38. Exemplary circuits are described below. In other embodiments, the circuit 36 is or includes a load for the circuit 34. The term "circuit" is used herein to include circuitry having one or more circuit elements.

Taken together, the bond pad structures 24, 26 may be shaped and/or sized similarly to the bond pads (not shown) of the electronic apparatus 20 used for packaging connections. For example, the bond pad structures 24, 26 may be sized as a bond pad bisected by the gap 28. Each bond pad structure 24, 26 may include a metal layer or metal layer stack that corresponds with the layer or stack used to form the bond pads of the electronic apparatus 20. The top metal layer of the stack may vary, as the disclosed embodiments are capable of accommodating different metal materials, including, for example, gold, copper, and aluminum, as well as alloys containing one or more of these metals.

The bond pads may be sized to support an electrical connection with a package lead or other component of the package in which the electronic apparatus 20 is enclosed. The size and shape of the bond pad structures 24, 26 may vary. For example, the bond pad structures 24, 26 may be differently shaped or sized relative to one another.

The bond pad structures 24, 26 are electrically connected to one another rather than a package lead or other packaging component. The electrical connection is provided by a jumper 38. The jumper 38 extends across the gap 28. The jumper 38 is bonded to each of the bond pad structures 24, 26 to establish a nearly zero inductance connection between the circuits 34, 36. The bonds may be formed with an ultrasonic or other wedge bonder. The bonds are formed concurrently as the bonder applies energy to the wire.

Figure 2:
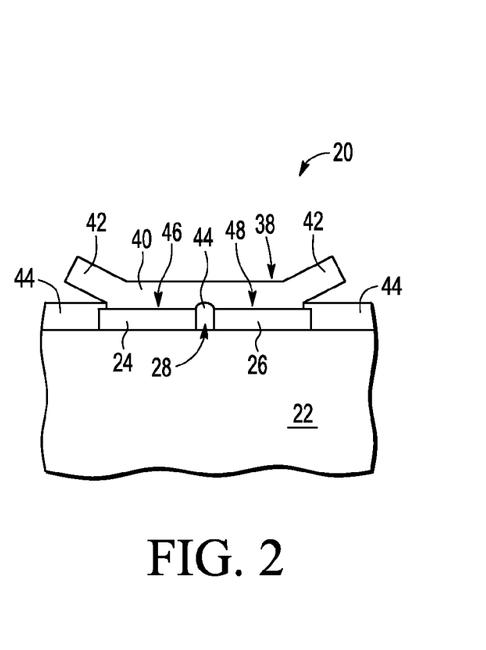
FIG. 2 is a schematic, cross-sectional view of the semiconductor device of FIG. 1 taken along lines 2-2 of FIG. 1.

In the example of FIGS. 1 and 2, the jumper 38 includes a wedge bond foot 40. The wedge bond foot 40 corresponds with a portion of the wire stamped or impressed by a wedge tip or tool of the wedge bonder. The wedge bond foot 40 is in contact with each of the bond pad structures 24, 26. The wire is severed or cut at the wedge bond foot 40. As a result, the wedge bond foot 40 does not laterally extend beyond the bond pad structures 24, 26 much, if at all. In the example of FIGS. 1 and 2, the wedge bond foot 40 may include one or more tails 42 at either end thereof. The tails 42 correspond with any length of wire not bonded to one of the bond pad structures 24, 26. Thus, as shown, the wedge bond foot 40 may include a short length of wire not stamped by the bonder. The length of the wedge bond foot 40 may thus approximate, or correspond with, the lateral extent of the bond pad structures 24, 26.

As shown in FIGS. 1 and 2, the electronic apparatus 20 may include a passivation layer 44 that extends across the substrate 22 and the metal layer in which the interconnect lines 30, 32 and the bond pad structures 24, 26 are formed. The passivation layer 44 may include one or more dielectric materials, such as silicon nitride. Openings 46, 48 are formed in the passivation layer 44 to expose and/or define the bond pad structures 24, 26, respectively. The remainder of the electronic apparatus 20 may be covered by the passivation layer 44. For example, the lines 30, 32 (FIG. 1) may be entirely covered by the passivation layer 44. The passivation layer 44 and the openings 46, 48 therein are shown in phantom in FIG. 1 for ease in illustration of the underlying elements of the electronic apparatus 20.

The passivation layer 44 may be disposed in the gap 28, as shown in FIG. 2. The passivation layer 44 may be deposited and patterned such that the dielectric material laterally overlaps the bond pad structures 24, 26. As shown in FIG. 1, the overlap may be present around an entire border or perimeter of the bond pad structures 24, 26. In one example, the overlap may have a width of about 5 microns. The passivation layer 44 may thus overlap the bond pad structures 24, 26 along the gap 28 prior to the formation of the edge bond foot jumpers 38.

The wedge bond foot jumpers 38 described herein are bonded to the bond pad structures 24, 26 despite the overlap and presence of the passivation layer 44 on the bond pad structures 24, 26. The energy imparted to the bond wire during wedge bonding may be sufficient to crush the dielectric material and/or push the dielectric material out or away from the bond pad structure 24, 26 and the bond wire. The boundary of the openings 46, 48 may thus be pushed toward the gap 28 as shown in FIG. 1. The wedge bond foot may thus bond with the bond pad structures 24, 26. The disclosed embodiments are not limited to those in which the wedge bond pad foot jumpers 38 displace the passivation layer 44 during wedge bond foot formation. For example, an electrical connection may still be established between the wedge bond foot jumper 38 and the bond pad structures 24, 26 in cases where the passivation layer overlap remains present during bonding.

The wire used to form the wedge bond foot 40 may include various metals. For example, gold, aluminum, and copper may be used. The wire metal may be selected in accordance with the metal used to form the bond pad structures 24, 26, or the uppermost layer thereof.

The disclosed embodiments are not limited to any particular shape or configuration of the wedge tip or tool. Various wedge bonder tips or tools may be used.

The gap 28 may be a narrow gap. For example, the gap 28 may have a width corresponding with a minimum dimension or feature size available under the design rules governing the device fabrication. In some cases, the width may be between about 5 microns and about 10 microns. Other dimensions may be used. In one example in which the wire diameter is between about 2.0 and about 2.4 mils, each bond pad structure 24, 26 (e.g., half of a bisected bond pad) may have a width between about 1.5 mils and 4 mils (e.g., in the lateral direction of the gap spacing), and the gap 28 may have a width between about 5 microns and about 15 microns. The jumper 38 may have a length greater than the corresponding width of the gap 28, e.g., between about 7 mils and about 8 mils. Smaller gap widths and jumper lengths may thus be used in cases, for instance, in which a smaller diameter wire is used. Wider gap widths may also be used. For example, the gap spacing may range up to about 40 microns or about 50 microns. The gap spacing may vary based on the size (e.g., length) of the wedge bond foot. The gap spacing may be as large as about 50% of the bond foot length.

The gap 28 allows the circuit 34 to be disconnected from the circuit 36 until the jumper 38 is bonded to the bond pad structures 24, 26. While disconnected, the circuit 34 may be disposed in a first operational configuration. Once connected with the circuit 36, the circuit 34 may be disposed in a second operational configuration different than the first operational configuration. The circuit 36 may thus provide a selectable option for the circuit 34. Multiple options may be provided via multiple gap/jumper arrangements.

The jumper 38 may be bonded to the bond pad structures 24, 26 after probing or other testing of the circuit 34. The circuit 36 may be, present, or otherwise include a load for the circuit 34. For example, the circuit 36 may include a large impedance that would distort or otherwise affect the test of the circuit 34. The bond pad structure 24 may be sized to accommodate a probe in such cases. Probing or other testing of the circuit 34 is not limited to cases in which the circuit 36 presents a load. The gap 28 may also be used to support probing or other testing of the circuit 36.

Figure 3:
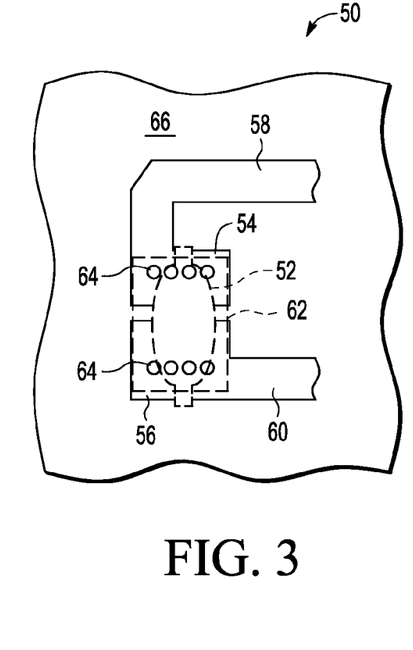
FIG. 3 is a schematic, plan view of an exemplary semiconductor device having a bypass electrical connection established with a wedge bond foot jumper in accordance with one embodiment.

FIG. 3 depicts a portion of an electronic apparatus 50 having a jumper 52 configured as, or disposed in, a bypass path or a short-circuit element. The electronic apparatus 50 includes bond pad structures 54, 56 to which the jumper 52 is bonded. The bond pad structures 54, 56 are, in turn, electrically connected to conductive lines 58, 60, respectively. The jumper 52, the bond pad structures 54, 56, and the lines 58, 60 may be configured similarly to those described above in connection with FIGS. 1 and 2. The nature of the circuits to which the lines 58, 60 are connected may vary.

The jumper 52 is connected across a gap between the bond pad structures 54, 56 to establish a bypass path across a circuit element disposed between the bond pad structures 54, 56. In this embodiment, the circuit element of the electronic apparatus 50 bypassed by the jumper 52 is a resistor 62. The resistor 62 is electrically connected to the bond pad structures 54, 56. In this example, the electrical connections are established with a number of vias 64. Each via 64 extends from vertically from one of the bond pad structures 54, 56 to a lower layer or level in which the resistor 62 is disposed. For example, the resistor 62 may be buried in a substrate 66. For example, the resistor 62 may include a doped region of the substrate 66 having a dopant concentration level and dimensions to establish a resistance level thereof. In other embodiments, the resistor 62 may be disposed in one or more other lower layers. For example, the resistor 62 may include a lower polysilicon, metal, or other layer supported by the substrate 66. The lower layer is connected by the vias 64 to the top metal layer in which the bond pad structures 54, 56 are formed. The layer may be spaced from the metal layer(s) in which one or both of the bond pad structures 54, 56 are formed by a number of passivation layers through which the vias 64 extend.

The circuit element may vary in other embodiments. For example, the circuit element may be or include a diode. Further details regarding an exemplary embodiment are set forth in connection with FIGS. 5 and 6. In still other embodiments, multiple circuit elements may be disposed between the bond pad structures 54, 56. For example, another circuit element may be disposed in series with the resistor 62 between the bond pad structures 54, 56.

Figure 4:
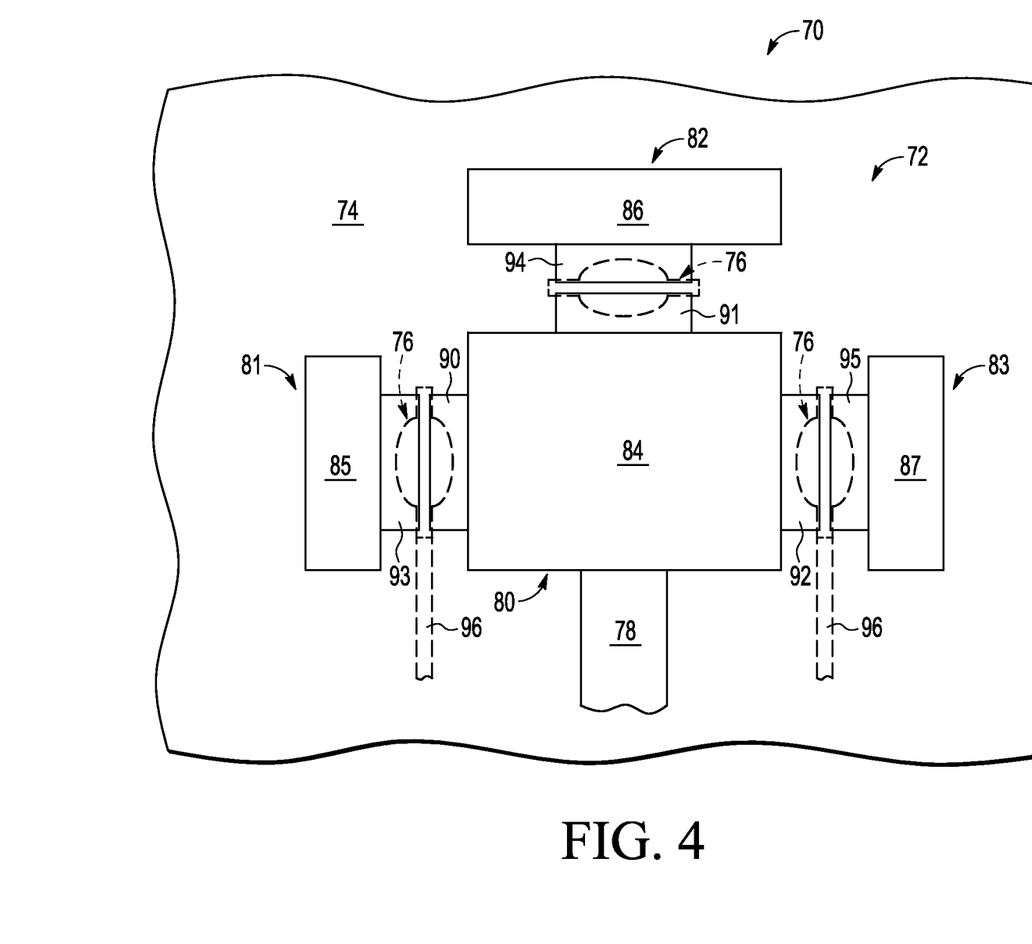
FIG. 4 is a schematic, plan view of an exemplary semiconductor device configurable through a set of wedge bond foot jumper connections in accordance with one embodiment.

FIG. 4 depicts a portion of an exemplary electronic apparatus 70 having a configurable or tunable capacitor 72 disposed on and/or in a substrate 74. The capacitor 72 is made configurable through a number of optional connections, each connection involving a respective jumper 76. Each jumper 76 includes a wedge bond foot as described herein. In this example, the capacitor 72 is electrically connected with a primary circuit (not shown) of the electronic apparatus 70 with a conductive line 78. In other embodiments, the conductive line 78 may include or be replaced by another wedge bond foot jumper.

In the embodiment of FIG. 4, the capacitor 72 includes a primary capacitive element 80 and three auxiliary or secondary capacitive elements 81-83. Each capacitive element 80-83 may include a respective metal or other conductive plate 84-87. Each conductive plate 84-87 may be spaced from another conductive plate (not shown) in accordance with a parallel plate capacitor arrangement. For example, the conductive plate may be disposed in a lower metal layer. One or more passivation or other dielectric layers may be disposed between the conductive plate 84-87 and the respective conductive plate in the lower metal layer. In other embodiments, each capacitive element 80-83 includes a region or layer other than another metal layer. For example, a parallel plate capacitor arrangement may be established with a polysilicon layer supported by the substrate 74 or a doped region of the substrate 74. Other structures and/or arrangements may be used for each capacitive element of the capacitor 72. For example, the plates or other components of each capacitive element 80-83 may be spaced from one another laterally rather than vertically.

Pairs of bond pad structures are used to selectively connect the auxiliary capacitive elements 81-83 with the primary capacitive element 80. Each bond pad structure pair is spaced from one another by a gap and supported by the substrate 74 as described above. In the embodiment of FIG. 4, the primary conductive element 84 is contiguous with, and electrically connected to, bond pad structures 90-92. For example, each bond pad structure 90-92 may be contiguous with, and electrically connected to, the conductive plate 84 of the capacitive element 80. Each auxiliary capacitive element 81-83 is contiguous with, and electrically connected to, a respective one of bond pad structures 93-95. For example, the bond pad structures 93-95 may be contiguous with, and electrically connected to, the conductive plates 85-87 of the capacitive element 81-83, respectively. The bond pad structures 90 and 93 are spaced from one another for optional connection of the capacitive element 81. The bond pad structures 91 and 94 are spaced from one another for optional connection of the capacitive element 82. The bond pad structures 92 and 95 are spaced from one another for optional connection of the capacitive element 83. In some cases, each bond pad structure may be integrally formed with the respective capacitive element (or plate thereof) with which the bond pad structure is contiguous. For example, the bond pad structure and the metal plate of the capacitive element are formed in a common metal layer supported by the substrate 74.

As shown in FIG. 4, the principal axes of the wedge bond foot jumpers 76 may be oriented in different directions. The disclosed embodiments are not limited to apparatus in which the wedge bond foot jumpers are all aligned. The different axes may be useful in connection with establishing further optional connections. In the example of FIG. 4, additional connections to the capacitor 72 may be established through use of wire bonds 96 extending from one or more of the jumpers 76. Each wire bond 96 may extend from the wedge bond foot of the jumper 76 as shown. The disclosed embodiments may include apparatus in which the wedge bond foot jumpers are used for both electrical connection of the spaced apart bond pad structures as well as a further electrical connection through extension of the wire otherwise terminated at the wedge bond foot.

Figure 5:
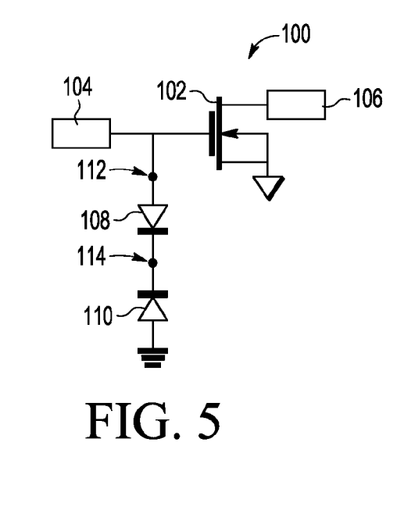
FIG. 5 is a circuit diagram of a semiconductor device having a configurable amplifier arrangement in accordance with one embodiment.
Figure 6:
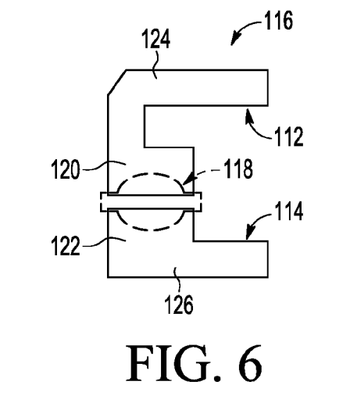
FIG. 6 is a schematic, plan view of a wedge bond foot jumper connection of the semiconductor device of FIG. 5.

FIGS. 5 and 6 depict another embodiment in which a wedge bond foot jumper is configured as a bypass path. In this embodiment, the circuit element bypassed by the jumper connection is a diode. As shown in FIG. 5, an amplifier circuit 100 includes a transistor device 102 controlled by an input 104 and driving a load 106. The amplifier circuit 100 is configurable via a pair of diodes 108, 110 coupling the gate electrode of the transistor device 102 to ground. In this embodiment, the diodes 108, 110 are disposed in series in an opposite polarity arrangement to modulate the gate bias voltage. The anode of the diode 108 is connected at a node 112 shared with the gate electrode, while the cathodes of the diodes 108, 110 are connected to one another at a node 114.

FIG. 6 depicts an optional bypass path 116 for the amplifier circuit 100 of FIG. 5. In this embodiment, the node 112 is optionally shorted to the node 114 by a wedge bond foot jumper 118. The jumper 118 is bonded to a pair of bond pad structures 120, 122. The bond pad structure 120 is electrically connected with a line 124 of the node 112. The bond pad structure 122 is electrically connected with a line 126 of the node 114. The bond pad structures 120, 122 are thus connected to a respective one of the terminals of the diode 108 to establish the bypass path across the diode 108.

The configurability provided by the wedge bond foot jumper 118 allows the amplifier circuit 100 to be configured as one of two types of Doherty amplifiers. Without the jumper 118, the bypass path is open, and the amplifier circuit 100 may be configured as a Doherty carrier amplifier. With the jumper 118, the bypass path is closed, and the amplifier circuit 100 may be configured as a Doherty peaking amplifier. In these examples, the diode 108 may be configured as a polysilicon diode. The polysilicon diode may include a resistor structure or network in which a diode is disposed, the resistor structure establishing a different turn-on voltage for the polysilicon diode. The diode 110 may be configured as an electrostatic discharge (ESD) protection diode.

During operation in accordance with an exemplary embodiment, the polysilicon diode 108 allows negative voltage swing across the gate junction greater than about −3 to about −10V. With the polysilicon diode 108, the ESD diode 110, which may be configured to conduct with a negative voltage greater than about −0.5V, does not conduct during input RF voltage swinging below the −0.5V level. The diodes 108, 110 may thus maintain a desired transistor quiescent bias current level. If the polysilicon diode 108 is shorted with the jumper 118, the ESD diode 110 conducts below the −0.5V swing on the gate. Such conduction causes the bias voltage to the gate to rise, creating a type of gate-bias modulation. In many cases, such gate bias modulation is undesirable, but for the auxiliary amplifier in Doherty arrangements, bias modulation that follows the envelope signal is desirable.

The disclosed embodiments are not limited to Doherty amplifiers. One or more wedge bond foot jumpers may be incorporated into other amplifier circuits to present a bypass path or other option. For example, wedge bond foot jumpers may be used in other carrier or main amplifier circuits. A wide variety of active circuits other than amplifier circuits may be selectively configured using one or more wedge bond foot jumpers.

Figure 7:
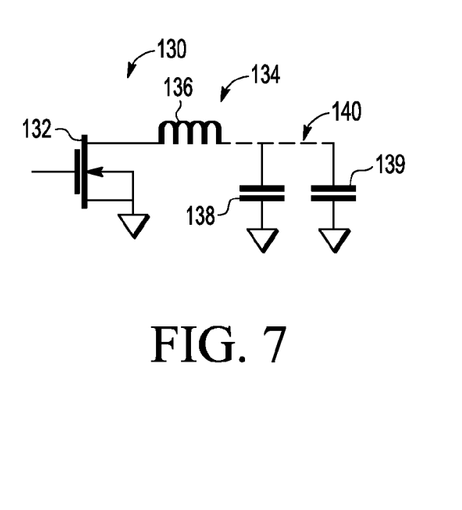
FIG. 7 is a circuit diagram of an exemplary semiconductor device having a configurable circuit arrangement in accordance with one embodiment.
Figure 8:
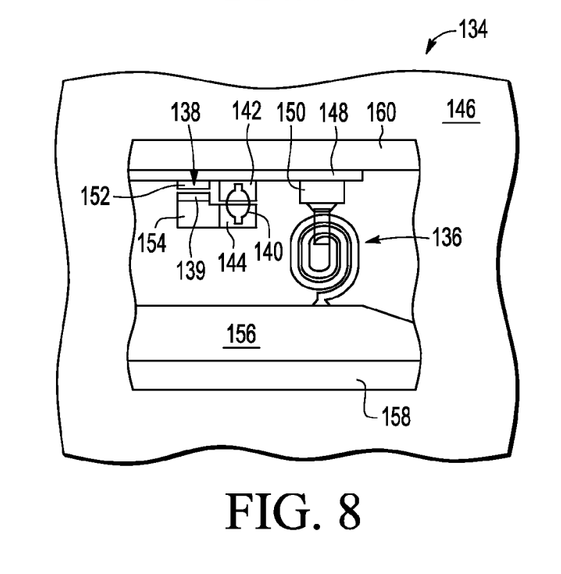
FIG. 8 is a schematic, plan view of a wedge bond foot jumper connection of the semiconductor device of FIG. 7.
Figure 9:
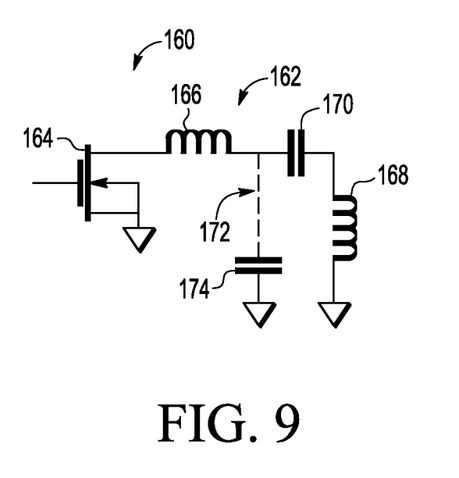
FIG. 9 is a circuit diagram of another exemplary semiconductor device having a configurable circuit arrangement in accordance with one embodiment.

FIGS. 7-9 depict examples of filter circuits configurable via wedge bond foot jumpers. As shown in FIG. 7, a filter circuit 130 includes a transistor device 132 coupled to a passive network 134. The passive network 134 includes an inductor 136 coupled to ground by shunt capacitors 138, 139. Other impedances and filter arrangements may be provided. A wedge bond foot jumper connection is used to customize the filter response of the passive network 134. For example, the jumper connection may be used to adjust the quality factor (Q), poles, and/or sharpness of the response.

A wedge bond foot jumper 140 is depicted as an optional connection of the capacitor 139. In this example, the capacitor 139 may thus be considered the auxiliary or secondary circuit, with the transistor device 132 and remaining components of the passive network 134 acting as the primary circuit. The connection of the capacitor 139 adjusts an operational characteristic of the filter circuit 130. In this example, the operational characteristic is the low-pass response of the filter circuit 130. In one example, the connection of the capacitor 139 may add a discrete amount of capacitance (e.g., 2 pF, 4 pF, or 6 pF) to the capacitance provided by the capacitor 138.

FIG. 8 shows the passive network 134 in accordance with an exemplary embodiment. The jumper 140 is bonded to a pair of bond pad structures 142, 144 supported by a substrate 146. The bond pad structure 142 and the capacitor 138 are electrically connected to the inductor 136 via interconnects 148, 150. The interconnect 148 may be configured as a bus interconnect. In this example, the capacitor 138 includes a capacitive element 152, such as a metal plate, supported by the substrate 146 and electrically connected to the line 148. The capacitive element 152 is spaced from a lower metal or other conductive layer or plate (not shown) supported by the substrate 146. For example, a silicon nitride or other dielectric layer may be disposed between the capacitive element 152 and the lower layer. To form a shunt capacitor, the lower layer may be electrically connected to a ground plate disposed on a backside of the substrate 146 by an array of vias (not shown).

The capacitor 139 is electrically connected to the jumper 140 and, thus, the bus interconnect 148, by an interconnect line 154. The capacitors 138 and 139 may be configured similarly. For example, each capacitive element of the capacitor 139 may be formed in a metal or other conductive layer supported by the substrate 146. Any number of capacitors may thus be added to the passive network 134 to achieve a desired filter response for the antenna circuit 130.

Also shown in FIG. 8 are a bus interconnect line 156 and passivation structures 158, 160. The interconnect line 156 electrically connects the inductor 136 to the remainder of the antenna circuit 130 (FIG. 7). The passivation structures 158, 160 may be patterned to allow bond wire connections to the bus interconnects 148, 156. Each passivation layer 158, 160 may include one or more dielectric materials, such as silicon nitride.

The wedge bond foot jumpers described herein may be used to configure a wide variety of passive networks. For example, FIG. 9 shows another filter circuit 160 having a passive network 162 with an optional bandpass configuration. A primary circuit of the filter circuit 160 includes a transistor device 164 and a high-pass filter of the passive network 162. The high-pass filter includes inductors 166, 168 and a capacitor 170. A wedge bond foot jumper 172 may connect a shunt capacitor 174 to configure the passive network 162 as a bandpass filter rather than a high-pass filter.

The jumper connections of the disclosed embodiments may be useful in a variety of passive and active circuits. The disclosed embodiments are thus not limited to the configurable filter circuits and other circuits and circuit elements described above. For example, one or more jumper connections may be used to configure antenna circuits, such as patch antenna circuits. The radiation pattern of the antenna circuit may be customized or changed through selective connections established by the wedge bond foot jumpers.

Figure 10:
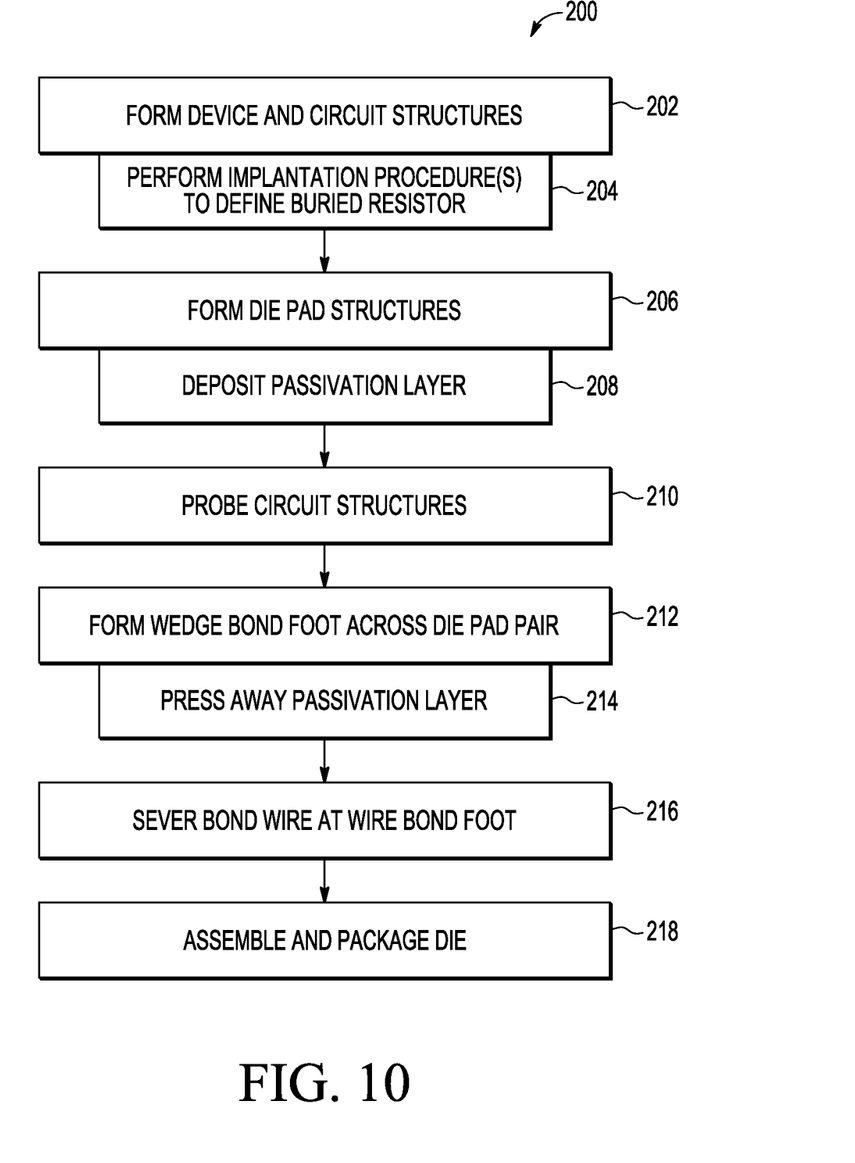
FIG. 10 is a flow diagram of an exemplary method of establishing an electrical connection in a semiconductor device with a wedge bond foot jumper in accordance with one embodiment.

FIG. 10 shows an exemplary method 200 for fabricating an electronic apparatus or a semiconductor device having a wedge bond foot jumper connection as described above. The method includes a sequence of acts or steps, only the salient of which are depicted for convenience in illustration. For instance, the method may begin a number of acts or steps directed to the preparation of a semiconductor substrate in and on which the semiconductor device is formed. In some cases, the preparation of the substrate may include the growth of one or more epitaxial layers in which device structures are defined. The ordering of the acts may vary in other embodiments. For example, one or more die assembly acts or steps may be performed before a wedge bond foot jumper connection is established.

The method 200 may begin with, or include, the formation of a number of device structures and circuit structures in act 202. The device structures may include a variety of different transistor device structures, such as source regions, drain regions, and other regions, defined in a semiconductor substrate. Other device structures may also be defined or formed in the substrate. For example, in the embodiment of FIG. 11, the act 202 includes the performance of one or more dopant implantation procedures to define in act 204 a buried resistor in the substrate. The resistor may then be bypassed by the jumper connection as described above. Alternative or additional resistor devices may be defined. For example, a resistor may be formed over the substrate through the deposition of a polysilicon or other material layer.

The act 202 may include the formation of a number of circuit structures over the substrate. For example, a number of metal structures may be deposited over the substrate to define interconnect lines. The metal structures may be disposed in a number of layers electrically separated from one another by passivation or dielectric layers deposited over the substrate.

In act 206, a number of die pad or bond pad structures are formed over the substrate. For example, the bond pad structures may be formed through the deposition of a top metal layer (or metal layer stack), e.g., the last metal layer to be deposited over the substrate. The bond pad structures include bond pads for packaging connectivity, as well as bond pad structures for the jumper connections as described above. The bond pads for packaging connectivity may be full size bond pads configured for a wire bond connection between the bond pad and a packaging pin or lead. In contrast, each bond pad structure for the jumper connections is one of a pair of bond pad structures spaced apart from one another by a gap. Taken together, the pair of bond pad structures may have a size commensurate with the size of one of the bond pads for packaging connectivity. The size of the bond pad structures for the jumper connections may vary. For example, the pair of bond pad structures may be sized, shaped, and/or otherwise configured differently than one another.

The act 206 may include the deposition and patterning of one or more passivation layers in act 208. The passivation layer(s) may include one or more dielectric materials. The patterning of the passivation layers may define a passivation border along the boundaries of the bond pad structures. The passivation border may laterally overlap the bond pad structures as described above. The dielectric material(s) of the passivation border may thus be disposed in the gap between the bond pad structures.

In the embodiment of FIG. 11, one or more circuits, circuit structures, or circuit elements thereof may be probed and/or tested in act 210. The circuit structures may be tested by probing one or more of the bond pad structures for the jumper connections. The manner in which the circuit structures are probed or tested may vary. The testing may be performed before the jumper connection is established. For example, it may be useful to perform the testing before a significant impedance, load, or other circuit element is electrically connected to a circuit by the jumper connection.

No probing or testing may be performed in some embodiments. For example, embodiments involving the configuration or tuning of a capacitor may not benefit from such testing.

In act 212, one or more wedge bond feet are formed. Each wedge bond foot extends across a respective one of the gaps. The wedge bond foot also extends across both of the bond pad structures spaced apart from one another by the gap. In some cases, the wedge bond foot may not extend across the entire lateral extent of the bond pad structures, but rather a fractio thereof. Any ultrasonic or other wedge bonder may be used to form the wedge bond foot.

Act 212 may include a decision block in which the formation of one or more of the wedge bond feet are conditioned upon a determination that a jumper connection is desired, warranted, or appropriate. Act 212 may thus also include one or more determination acts in preparation for the decision block. For example, a determination act may include a selection of one wedge bond foot a specific jumper connection out of a set of possible jumper connections. A capacitor or other circuit element may thus be customized or otherwise configured. Alternatively or additionally, whether a given jumper connection is to be established may be based upon the results of the testing or probing in act 210. A wide variety of factors may be considered in connection with determining or selecting one or more jumper connections.

The formation of the wedge bond feet may include the pushing away or crushing of a passivation layer in an act 214. The passivation layer has a respective opening over each bond pad structure. Before the act 212, the passivation layer may overlap the bond pad structures. For example, the overlap may be about 5 microns. The pressure provided by the wedge bonder may be sufficient to force the overlap of the passivation layer off of the bond pad structures. The wire may thus be impressed upon the bond pad structures to form the wedge bond. The overlap may vary. For example, in some cases, there may be less or no overlap.

The wire provided by the wedge bonder is severed at the wedge bond foot in act 216. As a result, little to no tail remains. The wedge bond foot may not laterally extend much, if at all, beyond the bond pad structures to which the wedge bond foot is bonded.

A number of assembly and packaging procedures may then be performed in an act 218. The manner in which the semiconductor device is packaged may vary. In some cases, wedge bonding may be used to connect bond pads to a lead frame. However, other types of packaging may be used.

Additional acts may be implemented at various points during the fabrication procedure. For example, one or more acts may be directed to dicing the substrate and otherwise forming respective semiconductor die. The procedures may be implemented in various orders. Additional or alternative procedures may be implemented.

The disclosed embodiments may support a variety of circuit options and configurations based on the placement of a wire or wedge bond foot. The circuit options may be on discrete or integrated circuit die. The circuit options may involve a variety of active or passive circuits or components. For example, the circuit options may involve matching elements such as MOSCAPs, integrated passive devices (IPDs), or packaging connections (e.g., package lead frame connections).

The disclosed embodiments may provide the capability to probe or test active elements or other circuits. The testing occurs before the bond foot connection is established. Such elements or circuits may otherwise be severely loaded by a high capacitance load presented via the connection. The load connection may then be established in, e.g., back end assembly, after the testing.

In a first aspect, a semiconductor device includes a substrate, first and second bond pad structures supported by the substrate and spaced from one another by a gap, and a wire bond foot jumper extending across the gap and bonded to the first and second bond pad structures.

In a second aspect, an electronic apparatus includes a substrate, first and second bond pad structures supported by the substrate and spaced from one another by a gap, a circuit electrically connected to the first bond pad structure, a circuit element electrically connected to the second bond pad structure, and a wedge bond foot extending across the gap and bonded to the first and second bond pad structures. The circuit is disposed in a first operational configuration with the wedge bond foot bonded to the first and second bond pad structures. The circuit is disposed in a second operational configuration without the wedge bond bonded to the first and second bond pad structures.

In a third aspect, a method of fabricating a semiconductor device includes forming first and second bond pad structures over a substrate and spaced apart from one another by a gap, forming a wedge bond foot that extends across the gap and across both the first and second bond pad structures, and severing the bond wire at the wedge bond foot to define a wedge bond foot jumper bonded to the first and second bond pad structures.

The present invention is defined by the following claims and their equivalents, and nothing in this section should be taken as a limitation on those claims. Further aspects and advantages of the invention are discussed above in conjunction with the preferred embodiments and may be later claimed independently or in combination.

While the invention has been described above by reference to various embodiments, it should be understood that many changes and modifications may be made without departing from the scope of the invention. It is therefore intended that the foregoing detailed description be regarded as illustrative rather than limiting, and that it be understood that it is the following claims, including all equivalents, that are intended to define the spirit and scope of this invention.

The invention claimed is:

1. A semiconductor device comprising: a substrate;
   first and second bond pad structures supported by the substrate and spaced from one another by a gap;
   a wire bond foot jumper extending across the gap and bonded to the first and second bond pad structures;
   wherein the wire bond foot jumper comprises a wedge bond foot in direct contact with the first and second bond pad structures; and
   wherein the wire bond foot jumper is configured to establish a bond foot connection with the first and second bond pad structures.

2. The semiconductor device of claim 1, further comprising:
   a primary circuit electrically connected to the first bond pad structure; and
   a secondary circuit electrically connected to the second bond pad structure;
   wherein the primary circuit is disposed in different operational configurations based on whether the wire bond foot jumper is bonded to the first and second bond pad structures.

3. The semiconductor device of claim 2, wherein:
   the primary circuit comprises a passive network; and
   the secondary circuit comprises an impedance to modify an operational characteristic of the primary circuit.

4. The semiconductor device of claim 1, further comprising a circuit element electrically connected to the first and second bond pad structures, wherein the wire bond foot jumper is connected as a bypass path across the circuit element.

5. The semiconductor device of claim 4, wherein the circuit element is formed in the substrate.

6. The semiconductor device of claim 4, wherein the circuit element comprises a resistor.

7. The semiconductor device of claim 4, wherein the circuit element comprises a diode.

8. The semiconductor device of claim 1, further comprising first and second capacitive elements supported by the substrate and electrically coupled to the first and second bond pad structures, respectively.

9. The semiconductor device of claim 8, further comprising first and second shunt capacitors, wherein the first and second shunt capacitors comprise the first and second capacitive elements, respectively.

10. The semiconductor device of claim 1, further comprising a configurable capacitor, the configurable capacitor comprising:
    the first and second bond pad structures;
    third and fourth bond pad structures supported by the substrate and spaced from one another by a further gap;
    a first capacitive element contiguous with, and electrically connected to, the first bond pad structure and the third bond pad structure;
    a second capacitive element contiguous with, and electrically connected to, the second bond pad structure; and
    a third capacitive element contiguous with, and electrically connected to, the fourth bond pad structure.

11. The semiconductor device of claim 1, wherein the wire bond foot jumper has a length between about 7 mils and about 8 mils.

12. The semiconductor device of claim 1, wherein the gap has a width between about 5 microns and about 10 microns.

13. The semiconductor device of claim 1, wherein the wire bond foot jumper comprises a wedge bond foot that spans the first and second bond pad structures.

14. An electronic apparatus comprising:
    a substrate;
    first and second bond pad structures supported by the substrate and spaced from one another by a gap;
    a circuit electrically connected to the first bond pad structure; a circuit element electrically connected to the second bond pad structure; and
    a wedge bond foot extending across the gap and bonded to the first and second bond pad structures;
    wherein the circuit is disposed in a first operational configuration with the wedge bon foot bonded to the first and second bond pad structures;
    wherein the circuit is disposed in a second operational configuration without the wedge bond foot bonded to the first and second bond pad structures; and
    wherein the wedge bond foot is in direct contact with the first and second bond pad structures.

15. The electronic apparatus of claim 14, further comprising a further circuit element electrically connected to the first and second bond pad structures, wherein the wedge bond foot is connected as a bypass path across the further circuit element.

16. The electronic apparatus of claim 14, wherein the circuit comprises a first capacitive element and the circuit element comprises a second capacitive element.

17. The semiconductor device of claim 14, wherein the wedge bond foot spans the first and second bond pad structures.

* * * * *